(12) United States Patent
Arnold et al.

(10) Patent No.: US 10,461,157 B2
(45) Date of Patent: Oct. 29, 2019

(54) FLAT GATE COMMUTATED THYRISTOR

(71) Applicant: ABB Schweiz AG, Baden (CH)

(72) Inventors: Martin Arnold, Cambridge (GB);
Umamaheswara Vemulapati,
Wettingen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/918,581

(22) Filed: Mar. 12, 2018

(65) Prior Publication Data

US 2018/0204913 A1 Jul. 19, 2018

Related U.S. Application Data

(63) Continuation of application No. PCT/EP2016/071353, filed on Sep. 9, 2016.

(30) Foreign Application Priority Data

Sep. 11, 2015 (EP) ..................................... 15184822

(51) Int. Cl.
*H01L 29/74* (2006.01)
*H01L 29/10* (2006.01)
(Continued)

(52) U.S. Cl.
CPC ...... *H01L 29/1066* (2013.01); *H01L 29/0696* (2013.01); *H01L 29/0839* (2013.01);
(Continued)

(58) Field of Classification Search
None
See application file for complete search history.

(56) References Cited

U.S. PATENT DOCUMENTS 4,224,634 A 9/1980 Svedberg
4,394,677 A * 7/1983 Jaecklin ............... H01L 29/7412
257/152
(Continued)

FOREIGN PATENT DOCUMENTS

DE 2625917 A1 12/1976
EP 0002840 A1 7/1979
(Continued)

OTHER PUBLICATIONS

European Patent Office, International Search Report & Written Opinion issued in corresponding Application No. PCT/EP2016/071353, dated Nov. 24, 2016, 12 pp.
(Continued)

*Primary Examiner* — Ali Naraghi
(74) *Attorney, Agent, or Firm* — Taft Stettinius & Hollister LLP; J. Bruce Schelkopf

(57) ABSTRACT

The invention relates to a turn-off power semiconductor device comprising a plurality of thyristor cells, each thyristor cell comprising a cathode region; a base layer; a drift layer; an anode layer; a gate electrode which is arranged lateral to the cathode region in contact with the base layer; a cathode electrode; and an anode electrode. Interfaces between the cathode regions and the cathode electrodes as well as interfaces between the base layers and the gate electrodes of the plurality of thyristor cells are flat and coplanar. In addition, the base layer includes a gate well region extending from its contact with the gate electrode to a depth, which is at least half of the depth of the cathode region, wherein, for any depth, the minimum doping concentration of the gate well region at this depth is 50% above a doping concentration of the base layer between the cathode region and the gate well region at this depth and at a lateral position, which has in an orthogonal projection onto a plane parallel to the first main side a distance of 2 μm from the (Continued)

cathode region. The base layer includes a compensated region of the second conductivity type, the compensated region being arranged directly adjacent to the first main side and between the cathode region and the gate well region, wherein the density of first conductivity type impurities relative to the net doping concentration in the compensated region is at least 0.4.

17 Claims, 11 Drawing Sheets

(51) Int. Cl.
    *H01L 29/36*         (2006.01)
    *H01L 29/744*      (2006.01)
    *H01L 29/08*         (2006.01)
    *H01L 29/06*         (2006.01)
    *H01L 29/417*       (2006.01)
    *H01L 29/66*         (2006.01)
    *H01L 29/745*       (2006.01)

(52) U.S. Cl.
    CPC ............ *H01L 29/102* (2013.01); *H01L 29/36* (2013.01); *H01L 29/41716* (2013.01); *H01L 29/66363* (2013.01); *H01L 29/744* (2013.01); *H01L 29/745* (2013.01); *H01L 29/0692* (2013.01); *H01L 29/66393* (2013.01)

(56) References Cited

U.S. PATENT DOCUMENTS

| | | | | |
|---|---|---|---|---|
| 4,613,381 | A | * | 9/1986 | Ogura ................. H01L 21/2252 257/E21.146 |
| 4,862,230 | A | * | 8/1989 | Uji ...................... H01L 33/0025 257/96 |
| 5,369,291 | A | * | 11/1994 | Swanson ................. H01L 29/74 257/107 |
| 2015/0228446 | A1 | * | 8/2015 | Breymesser .......... H01L 29/861 257/147 |

FOREIGN PATENT DOCUMENTS

| | | |
|---|---|---|
| EP | 0283788 A1 | 9/1988 |
| JP | H04320374 A | 11/1992 |
| JP | 3334509 B2 | 8/2002 |

OTHER PUBLICATIONS

European Patent Office, Extended Search Report issued in corresponding Application No. 15184822.3, dated Mar. 2, 2016, 10 pp.

\* cited by examiner

US 10,461,157 B2

FLAT GATE COMMUTATED THYRISTOR

FIELD OF THE INVENTION

The present invention relates to a turn-off power semiconductor device according to the preamble of claim 1 and to a method for manufacturing such turn-off power semiconductor device.

BACKGROUND OF THE INVENTION

From DE 26 25 917 A1 there is known a semi-conductor device including a semi-conductor body with four layers of alternate P and N conducting types, these layers constitute a thyristor whose outermost layers form emitter junctions with adjacent layers. The semi-conductor body also includes an integrated field effect transistor part for bridging one of the emitter junctions of the thyristor. The source and drain of the field effect transistor include regions of the same conductivity type, one of which forms the emitter layer adjacent to the bridged emitter junction and the other of which comprises a region ohmically connected to the layer adjacent to the emitter layer and of the same type of conductivity as the emitter layer. The field effect transistor has a control electrode and a protective diode is provided in the semi-conductor body for limiting voltage between the control electrode of the field effect transistor and the semi-conductor body. The thyristor is arranged for optical ignition. To provide a good ohmic contact between a gate electrode for ignition of the thyristor and a P-type base layer a highly doped $P^+$-type well region is provided below the electrode.

From EP 0 002 840 A1 there is known a thyristor wherein a N-type cathode emitter zone and a highly doped $P^+$-type gate region is embedded in a P-type base layer. The depth of the $P^+$-type gate region and of the N-type cathode emitter zone is about 15 μm.

From EP 0 283 788A1 there is known a GTO thyristor wherein a highly doped $P^+$-region is arranged below a P-doped base region. The dopant concentration of this P-base region is lower than the dopant concentration in the previously mentioned $P^+$-region The advantage of this is that the breakdown voltage between an N-emitter zone and the P-base region is largely independent of the depth of penetration of the N-emitter zone and of the selection of the transverse conductivity of the P-base zone.

From U.S. Pat. No. 5,369,291 A there is known a voltage controlled thyristor, which includes an intrinsic layer of material between an anode and a cathode. A gate region between the intrinsic layer and the cathode comprises a lightly doped P type layer with more heavily doped P type regions extending through the lightly doped layer into the intrinsic layer. The more heavily doped P type regions are interspersed among shallower N doped regions of the cathode.

From JP 3 334509 B2 there is known a gate-turn-off thyristor which enables uniform turn-off operation in respective regions, regardless of the position of a cathode electrode to thereby improve its shutdown immunity. The thyristor includes an N emitter layer on a cathode side, a P base layer, an N base layer and a P emitter layer on an anode side. The N emitter layer is made up of a plurality of regions mutually separated in the P base layer and elongated in a radius direction, and a cathode electrode is deposited on each of the separated regions of the emitter layer. Gate electrodes are deposited on the P base layer, so as to surround the respective regions of the N emitter layer. A gate lead metal in the form of a plate is formed on the nearly the entire surface of the gate electrodes as opposed thereto, and is provided therein with a plurality of openings, so as to surround the regions of the cathode electrode and to be electrically connected to the gate electrodes.

From JP H04 320374 A it is known to turn off a high anode current in a thyristor in a short time by providing an insulating film on a gate electrode and setting the sum of thickness of metal thin film and the insulating film thicker than a cathode metal electrode. An electrode of about 15p m thick is formed on the anode surface through aluminum deposition. Furthermore, aluminum is deposited by about 9 μm on the cathode surface to form a thin cathode electrode. Aluminum is further deposited by about 2 μm on the cathode surface to form first and second metal gate electrodes. At the same time, aluminum is deposited on the cathode electrode by about 11 μm. The cathode side surface is then covered with an insulator except the external terminal take-out parts of the cathode electrode and a gate electrode. The cathode electrode can be pressed by means of a thermal buffer having no groove and characteristics equivalent or better than those of GTO having a hybrid structure can be achieved.

A known turn-off power semiconductor device is the bi-mode gate commutated thyristor (BGCT) as shown in FIGS. 1 to 3. FIG. 1 shows the device in top view and FIG. 2 shows the device in cross-section taken along line c'c in FIG. 1. The BGCT comprises in a single wafer 1 a plurality of gate commutated thyristor (GCT) cells 2 electrically connected in parallel to one another. In the BGCT shown in FIGS. 1 and 2 each of the GCT cells 2 is made up from three cathode electrodes 3 in form of a cathode metallization layer, an $n^+$-doped cathode layer comprising three strip-shaped cathode segments 4, a p-doped base layer 5, an $n^-$-doped drift layer 6, an n-doped buffer layer 7, a $p^+$-doped anode layer 8 and an anode electrode 9 in form of an anode metallization layer. The GCT cells 2 also include a gate electrode 10 in form of a gate metallization layer, which is in contact with the p-doped base layer 5. The gate metallization layer is arranged in a plane, which is below the plane, in which the cathode electrodes 3 are arranged, so that the gate electrodes are vertically separated from the cathode electrodes 3. The BGCT includes one single gate contact 11 in the form of an annular metallic region in the center of the wafer 1. The gate contact 11 is in direct contact with the gate metallization layer, so that the gate contact 11 and the gate electrodes 10 of all GCT cells 2 are connected electrically and thermally with each other. The BGCT comprises a plurality of diode cells 12 distributed between the GCT cells 2. The diode cells 12 are electrically connected in parallel to one another and to the GCT cells 2, albeit with opposing forward direction. Each diode cell 12 includes an anode electrode 17, a p-doped anode layer 13, an $n^+$-doped cathode layer 14, and a cathode electrode 16, wherein the p-doped anode layer 13 and the $n^+$-doped cathode layer 14 are separated by the $n^-$-doped drift layer 6 and the n-doped buffer layer 7. Neighboring GCT cells 2 and diode cells 12 are separated by multiple separation regions 15.

FIG. 3 shows a partial cross-section of a segment of the BGCT shown in FIG. 2. There are shown two cathode segments 4 and a gate electrode 10 between these two cathode segments 4 in FIG. 3 in cross-section. On the main side surface of the wafer 1 an oxide passivation layer 19 is formed. The metallization layer forming the cathode electrodes 3 is in contact with the cathode segments 4 through first openings 20 in the oxide passivation layer 19 and the metallization layer forming the gate electrodes 10 is in contact with the base layer 5 through second openings 21 in the oxide passivation layer 19. A polyimide passivation layer 18 is formed between the cathode electrodes 3 on the oxide passivation layer 19 and the gate electrodes 10.

In FIGS. 4A to 4C there are illustrated steps of a manufacturing method for defining the cathode segments 4 in the before-described BGCT. As shown in FIG. 4A a patterned protection oxide layer 25 is formed on the main surface of a wafer, which includes the p-doped base layer 5 and a thin highly n$^+$-doped layer 26 formed on the p-base layer 5. In a next step, the thin highly n$^+$-doped layer 26 and part of the p-doped base layer 5 is etched by about 13 μm using the patterned protection oxide layer 25 as an etching mask to obtain a structure as shown in FIG. 4B. In a subsequent drive-in step, the n-type dopant of the structured highly n$^+$-doped layer 26' is driven into the p-doped base layer 5 to obtain the cathode segments 4 as in the final structure shown in FIG. 3.

In all subsequent process steps of the method for manufacturing the BGCT, namely in the steps of forming the oxide passivation layer 19, the cathode electrodes 3, the gate electrodes 10 and the polyimide passivation layer 18, there is the problem that respective layers including the photoresist layers used for structuring the layers have to be deposited on a structured surface of the wafer 1 having steps in the wafer surface. Accordingly, issues related to step coverage of these layers can result. Also, the steps in the wafer surface reduce the space available for the cathode electrodes 3, and, therefore, limit the electrical and thermal contact. Besides the limitation of the electrical and thermal contact, the steps in the wafer surface make it impossible to reduce certain lateral dimensions and limit minimum dimensions as well as the density of the cathode segments 4. For example, the distance between each first opening 20 (i.e. cathode opening) and a neighbouring second opening 21 (i.e. gate opening) cannot be made smaller than 50 μm due to the step in the wafer surface between each first opening 20 and a neighbouring second opening 21.

In view of the above, it is the object of the invention to provide a turn-off power semiconductor device, which can overcome the above-described problems in the prior art. In particular, it is an object of the invention to provide a turn-off power semiconductor device having a plurality of thyristor cells, in which the density of separate cathode regions and/or the density of thyristor cells can be increased, any issues related to step coverage can be avoided and an electrical and thermal contact area can be increased, while ensuring a good performance of the turn-off power semiconductor device especially during turn-off.

The object of the invention is attained by a turn-off power semiconductor device according to claim 1.

In the turn-off power semiconductor device of the invention, interfaces between the cathode regions and the cathode electrodes as well as interfaces between the base layers and the gate electrodes of the plurality of thyristor cells are flat and coplanar. Due to this feature of the turn-off power semiconductor device of the invention, all issues related to step coverage in the turn-off power semiconductor device known from the prior art are avoided. Further, the flat design results in more available space for the cathode metallization so that the electrical and thermal contact is improved. Lateral dimensions can be reduced compared to the turn-off power semiconductor device of the prior art and, therefore, the density of the cathode regions and/or the density of the thyristor cells in the device can be increased.

In addition, the turn-off power semiconductor device of the invention differs from the above described known turn-off power semiconductor device in that the base layer includes a gate well region extending from its contact with the gate electrode to a depth, which is at least half of a depth of the cathode region, wherein, for any depth, the minimum doping concentration of the gate well region at this depth is 50% above a doping concentration of the base layer between the cathode region and the gate well region at this depth and at a lateral position, which has in an orthogonal projection onto a plane parallel to the first main side a distance of 2 μm from the cathode region. The highly doped gate well region results in a reduced serial resistance between the gate contact and a region just below the cathode region, thus allowing to increase the commutation current and to thereby improve the turn-off performance, while the lower doped portion of the base layer extending from the cathode region and arranged between the cathode region and the gate well region allows a sufficiently high gate-cathode blocking voltage (VGR) which is required for proper turn-off.

In the invention, the base layer includes a compensated region, which is arranged directly adjacent to the first main side and between the cathode region and the gate well region, wherein the density of first conductivity type impurities relative to the doping concentration in the compensated region is at least 0.4. With such feature, the gate-cathode blocking voltage (VGR) can be increased compared to a device without such highly compensated region.

Further developments of the invention are specified in the dependent claims.

In an exemplary embodiment, the depth of the gate well region is at least the depth of the cathode region. Exemplarily, the depth of the gate well region is at least 5 μm, more exemplarily at least 10 μm.

In an exemplary embodiment, the depth of the cathode regions is at least 10 μm, exemplarily at least 15 μm.

In an exemplary embodiment, the doping concentration of a portion of the base layer, which is arranged directly adjacent to the first main side and which is arranged between the cathode region and the gate well region, is increasing with increasing distance from the first main side. In such exemplary embodiment, a high gate-cathode blocking voltage (VGR) can be ensured. For proper turn-off of the device a gate-cathode blocking voltage of at least 20 V is preferable.

Exemplarily, the compensated region extends from the first main side to a depth, which is at least half of the depth of the cathode region. Specifically, the compensated region may extend from the first main side to a depth of at least 10 μm, exemplarily at least 15 μm.

In an exemplary embodiment, the cathode electrode has a thickness of at least 10 μm, exemplarily a thickness of at least 15 μm. The larger the distance between the level of the upper surface of the cathode metallization and the level of the upper surface of the gate metallization is, the better is the separation between a molybdenum (Mo) disc, which is used for contacting the cathode metallization layer in a standard press pack, and the gate metallization. A sufficient separation between the molybdenum disc and the gate metallization can avoid that small particles can cause a short circuit between the molybdenum disc and the gate metallization.

In an exemplary embodiment, a space between neighboring cathode electrodes is filled up with an insulating layer, and a continuous cathode contact layer is arranged on top of the cathode electrodes and the insulating layer to be in direct contact with the cathode electrodes and the insulating layer. In such exemplary embodiment, the thermal performance is improved. The continuous cathode contact layer on top of the cathode electrodes and on top of the insulating layer can increase the contact area and thus reduce the thermal resistance. In addition, such embodiment allows to bond the molybdenum disc to the front-side, e.g. by low-temperature bonding using Ag micro- or nano-particles. With such design, the turn-off power semiconductor device could even be used in modules, where the cathode contact is wire-bonded. Moreover, in such embodiment small particles cannot cause a short circuit between the molybdenum disc and the gate metallization.

The object is also attained by a method for manufacturing a turn-off power semiconductor device according to claim 10.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF COMPARATIVE EXAMPLES AND AN EMBODIMENT

Figure 1:
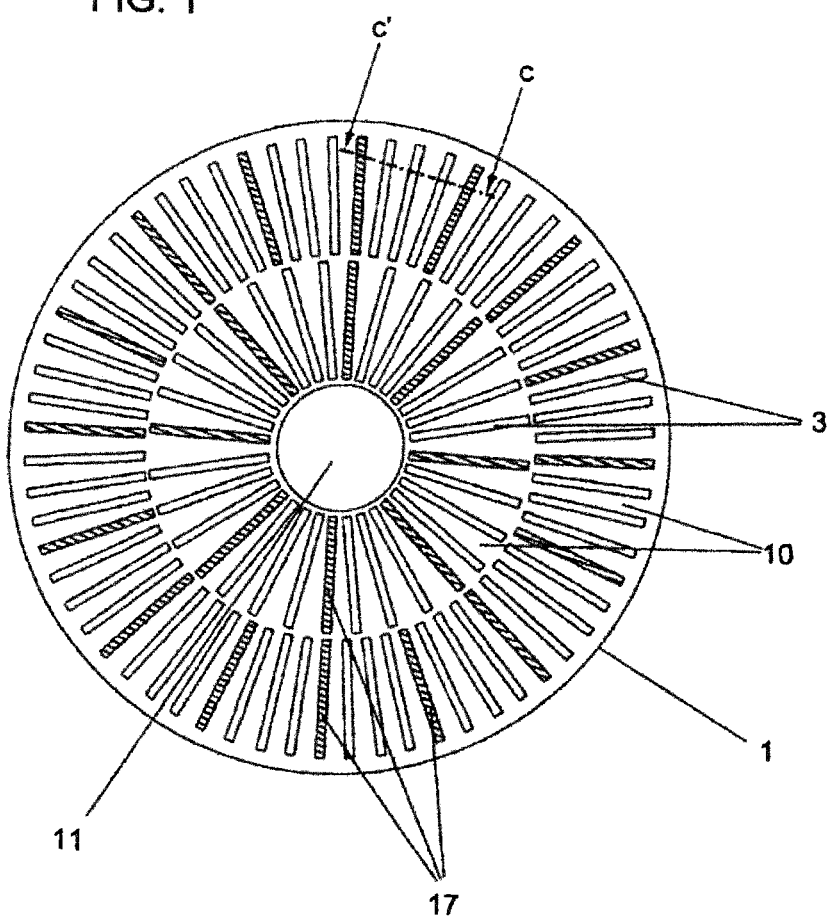
FIG. 1 shows a top view onto a bi-mode gate commutated thyristor (BGCT), which is a known turn-off power semiconductor device.
Figure 2:
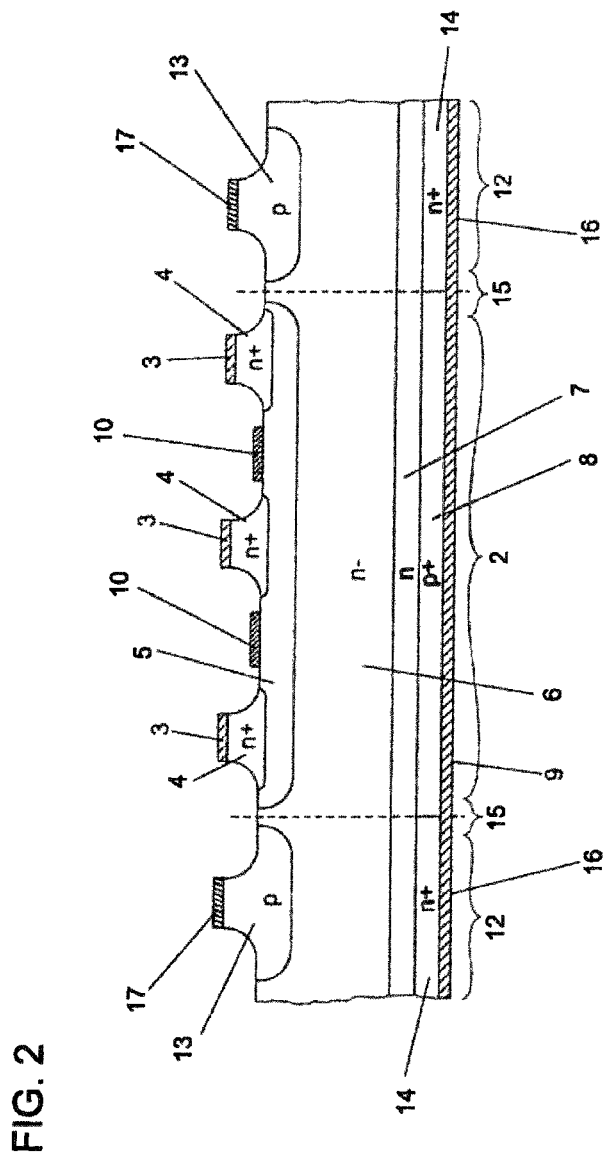
FIG. 2 shows a cross-section of the BGCT taken along line c'c in FIG. 1.
Figure 3:
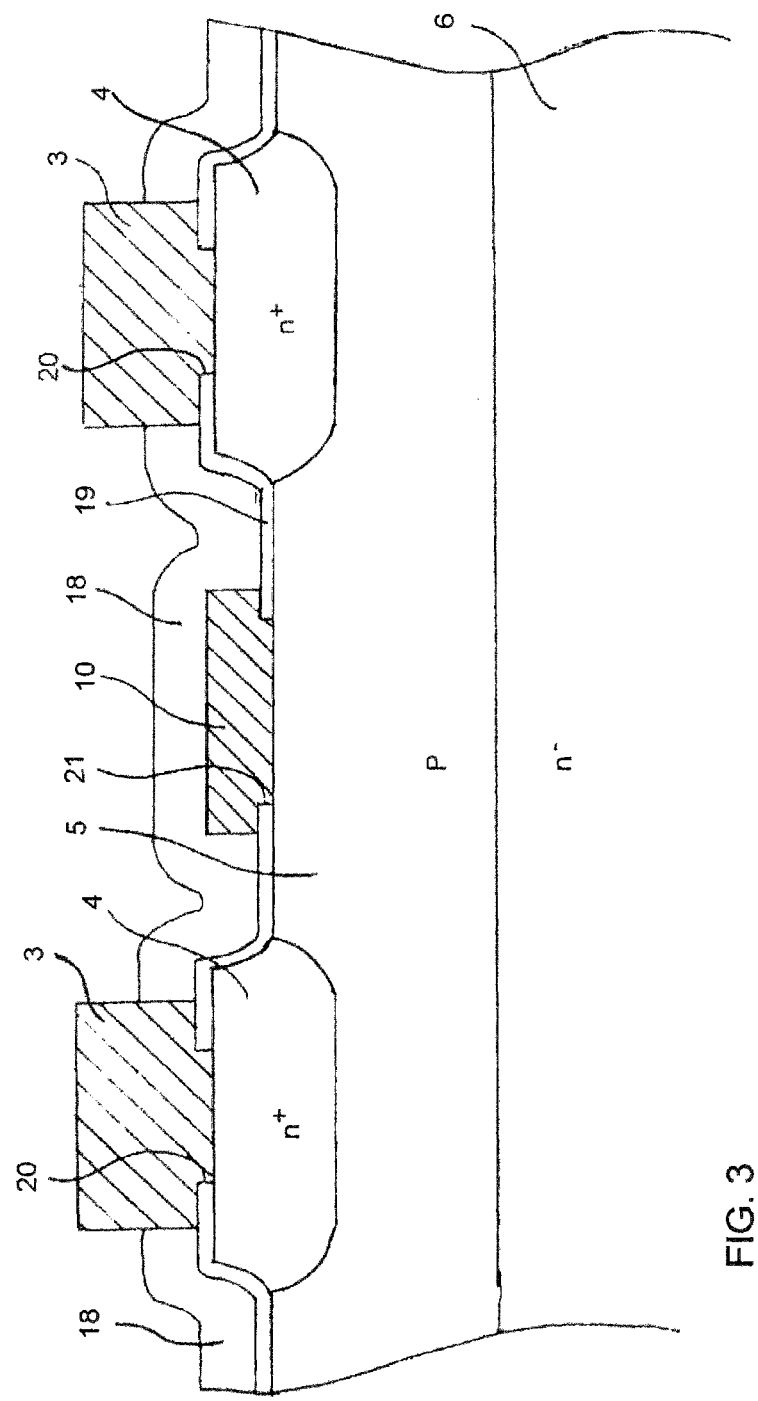
FIG. 3 shows an enlarged portion of the cross-section of FIG. 2.
Figure 4A:
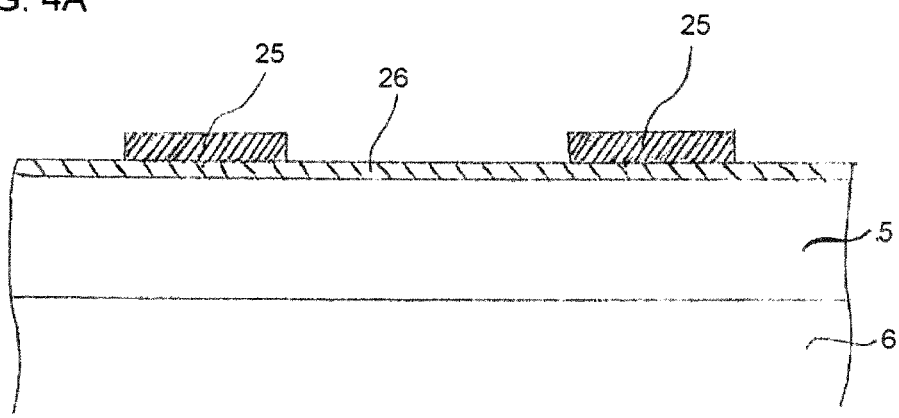
FIG. 4A to 4C illustrate steps of a manufacturing process, in which the cathode mesa structure of the BGCT shown in FIGS. 1 to 3 is formed.
Figure 4B:
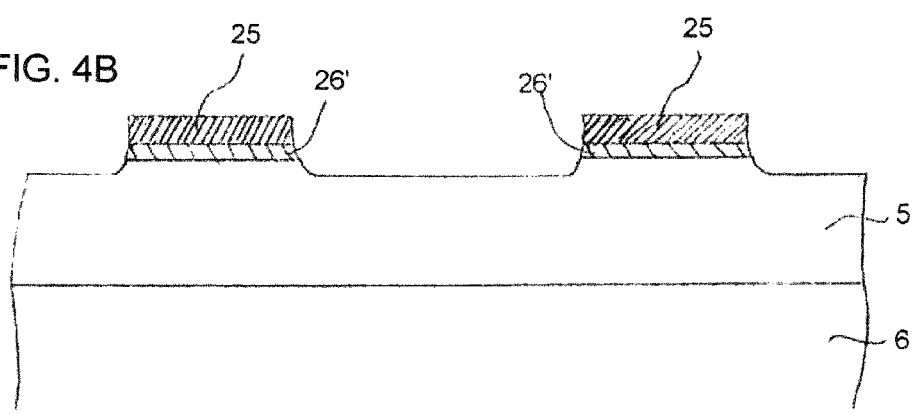
Figure 4C:
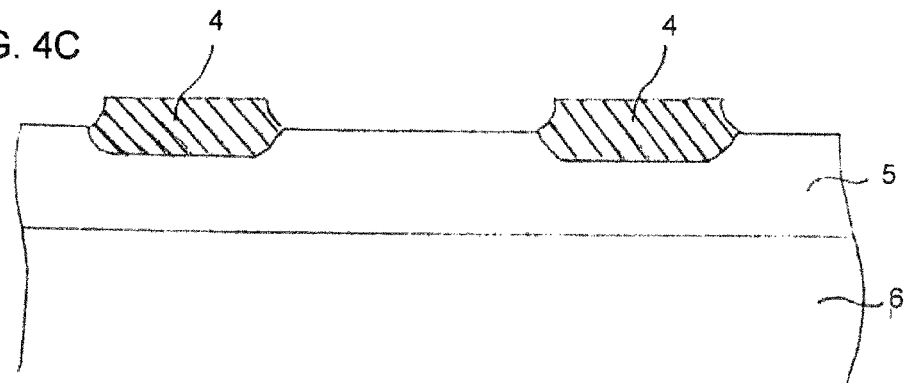
Figure 5:
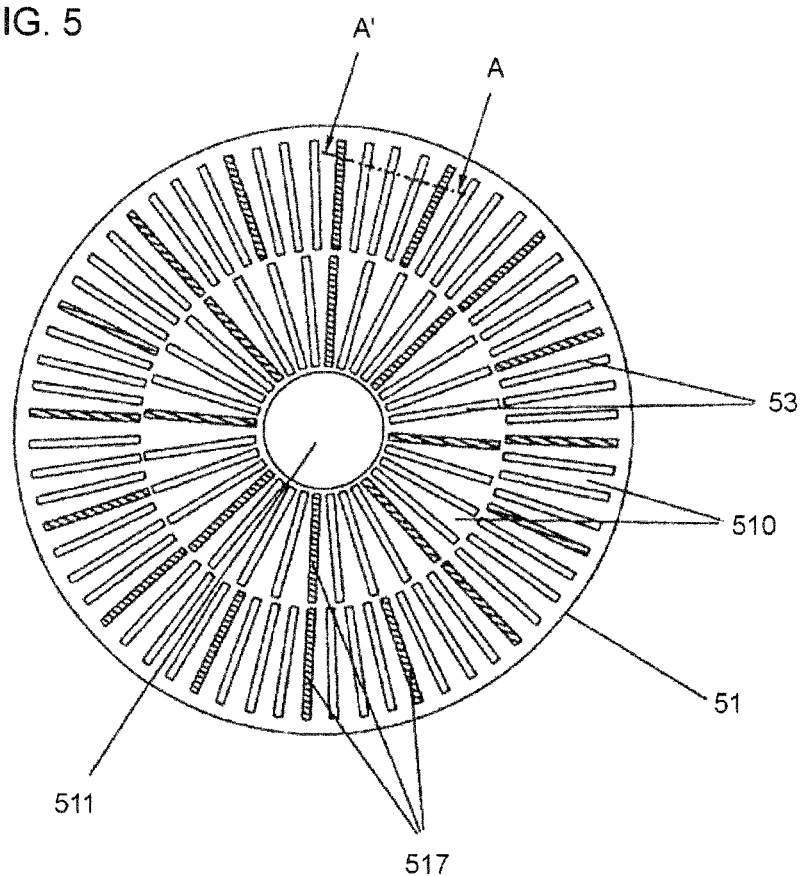
FIG. 5 shows a top view onto a turn-off power semiconductor device according to a comparative example.
Figure 6:
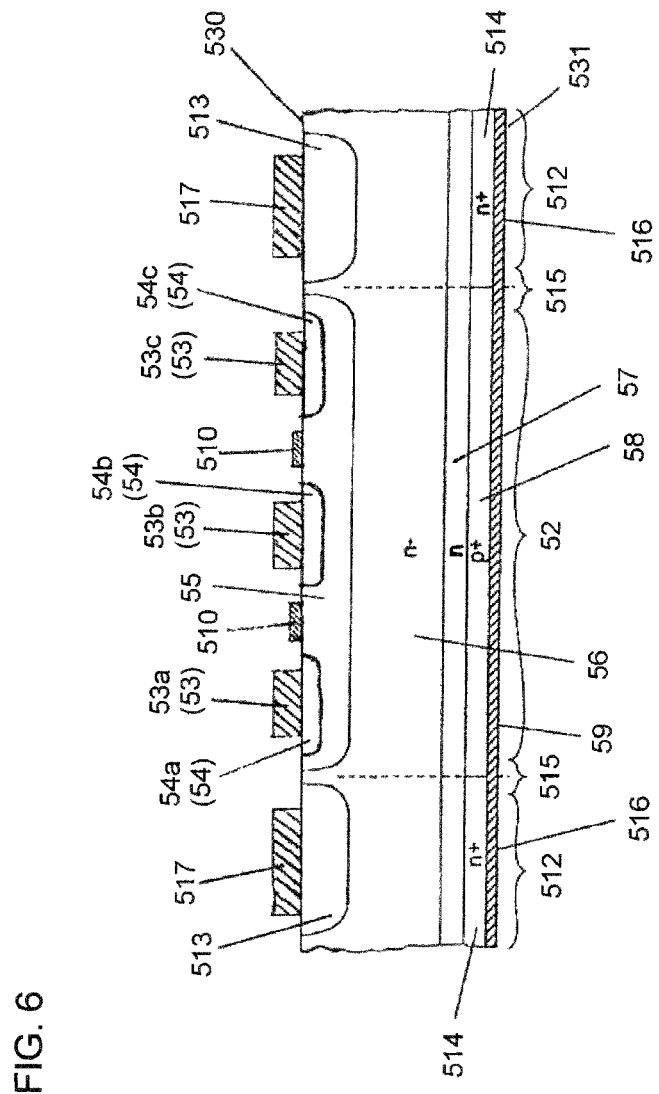
FIG. 6 shows a cross-section of the turn-off power semiconductor device of FIG. 5 taken along line AA' in FIG. 5.
Figure 7:
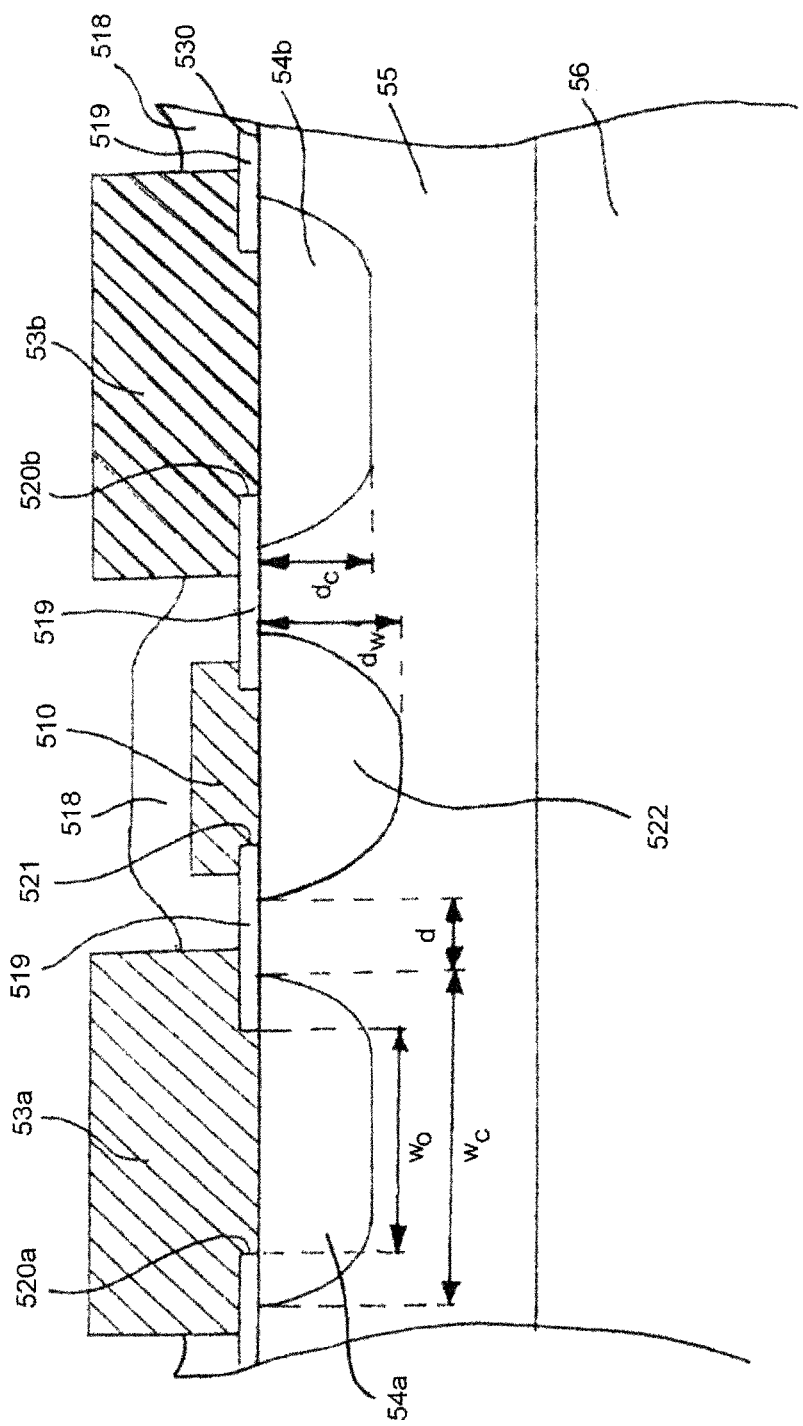
FIG. 7 shows an enlarged portion of the cross-section shown in FIG. 6.

In FIGS. 5 to 7 there is shown a comparative example of a turn-off power semiconductor device. This comparative example does as such not fall under the scope of the claims. However, the comparative example serves for a better understanding of the claimed invention. FIG. 5 shows a top view onto the turn-off power semiconductor device, FIG. 6 shows a cross-section thereof along a line AA' in FIG. 5, and FIG. 7 shows a partial cross-section, which is an enlarged portion of the cross-section shown in FIG. 6.

The turn-off power semiconductor device according to the comparative example comprises a semiconductor wafer 51, which is exemplarily a silicon wafer, having a first main side 530 and a second main side 531 opposite to the first main side 530. It comprises a plurality of gate commutated thyristor (GCT) cells 52 (which is an example for a thyristor cell in the claims) and a plurality of diode cells 512. Each GCT cell 52 comprises in the order from the first main side 530 to the second main side 531 a first cathode electrode 53, a n$^+$-doped first cathode layer 54, a p-doped base layer 55, a p$^+$-doped first anode layer 58, and a first anode electrode 59. The p-doped base layer 55 is separated from the p$^+$-doped first anode layer 58 by a n-doped drift layer 56 forming a pn-junction with the p-doped base layer 55 and by a n-doped buffer layer 57 forming a pn-junction with the p$^+$-doped first anode layer 58. The first cathode layer 54 of each GCT cell 52 comprises three cathode regions 54a, 54b, 54c, which are separated from each other by the base layer 55.

Further, each GCT cell 52 comprises a gate electrode 510, which is arranged lateral to the cathode regions 54a, 54b, 54c and which is separated from the cathode regions 54a, 54b, 54c by the base layer 55, respectively. Throughout this patent specification the term "lateral" relates to a lateral direction, which is a direction parallel to the first main side 530.

The drift layer 56 may have a doping concentration exemplarily between n=5.0·10$^{11}$ cm$^{-3}$ and n=1.0·10$^{14}$ cm$^{-3}$, more exemplarily less than 5·10$^{13}$ cm$^{-3}$. The first anode layer 58 may have an average doping concentration exemplarily between p=1·10$^{16}$ cm$^{-3}$ and p=1·10$^{19}$ cm$^{-3}$, and the cathode regions 54a, 54b, 54c may have a doping concentration exemplarily between n=1·10$^{18}$ cm$^{-3}$ and n=1·10$^{21}$ cm$^{-3}$, more exemplarily between n=1·10$^{19}$ cm$^{-3}$ and n=1·10$^{21}$ cm$^{-3}$. Adjacent to the first main side 530 the cathode regions 54 may have a doping concentration exemplarily between n=1·10$^{19}$ cm$^{-3}$ and n=1·10$^{21}$ cm$^{-3}$. Exemplarily, the cathode regions 54a, 54b, 54c of all thyristor cells 52 all have the same doping concentration. Likewise, all first anode layers 58 of all thyristor cells 52 may have the same doping concentration. Therein, the buffer layer 57 has a rising doping concentration towards the second main side 531, whereas the drift layer 56 has typically a constant doping concentration lower than that of the buffer layer 57. Throughout this specification, the term doping concentration refers to the net doping concentration. Further, throughout this specification the doping concentration of a layer refers to a local doping concentration in case that a doping profile of this layer is described. If no doping profile is described, the doping concentration of a layer refers to the maximum doping concentration in this layer unless indicated otherwise.

In the present comparative example, the base layers 55 exemplarily have a thickness in a direction perpendicular to the first and second main side 530, 531 of the wafer 51 between 70 and 130 μm. The first anode layers 58 exemplarily have a thickness between 1 μm and 250 μm. The base layers 55 may all have the same thickness. The thickness of each base layer 55 may be substantially constant throughout the GCT cell 52 or may vary to have less doping underneath the centre of the cathode regions 54a, 54b, 54c, respectively. The first anode layers 58 may also all have the same thickness. The thickness of the drift layer 56 in a direction perpendicular to the first and second main side 530, 531 of the wafer 51 depends on the rated voltage of the device. It is exemplarily between 280 μm and 440 μm for a 3.3 kV device or between 380 μm and 570 μm for a 4.5 kV device. Therein, the thickness of the drift layer 56 in a GCT cell 52 is the minimum distance between the buffer layer 57 and the base layer 55 of this specific GCT cell 52.

In orthogonal projection onto a plane parallel to the first main side 530 each one of the cathode regions 54a, 54b, 54c is strip-shaped. Throughout the specifications strip-shaped means a longitudinal shape wherein the length in the longitudinal direction is longer than the width of the strip-shaped region in a width direction perpendicular to the longitudinal direction and parallel to the first main side 530 of the wafer 51. Throughout this specification the width of a strip-shaped region is the maximum dimension of the strip-shaped region in the width direction.

In the orthogonal projection onto a plane parallel to the first main side 530, in each GCT cell 52, the lateral width $w_C$ of each strip-shaped cathode region 54a, 54b, 54c in a direction perpendicular to its longitudinal axis is exemplarily between 15 μm and 500 μm, more exemplarily between 100 μm and 300 μm. The length of each strip-shaped cathode region 54a, 54b, 54c in a direction parallel to its longitudinal axis (i.e. a radial, lateral direction in FIG. 5) is exemplarily in a range between 1.5 mm and 4 mm.

Each diode cell 512 comprises in the order from the first main side 530 to the second main side 531 a second anode electrode 517, a p-doped second anode layer 513, a n⁺-doped second cathode layer 514, and a second cathode electrode 516. The second cathode layer 514 is arranged alternating to the first anode layer 58 in a lateral direction on the second main side 531 and is separated from the second anode layer 513 by the drift layer 56 and the buffer layer 57. The drift layer 56 forms a pn-junction with the second anode layer 513. Each second anode layer 513 is, in orthogonal projection onto a plane parallel to the first main side 530, strip-shaped with a length in a direction along a longitudinal axis thereof and a width in a direction vertical to the longitudinal axis, the width of each second anode layer 513 being less than its length.

The second anode layers 513 may have a doping concentration exemplarily between $p=1 \cdot 10^{16}$ cm$^{-3}$ and $p=1 \cdot 10^{19}$ cm$^{-3}$, and the second cathode layers 514 may have a doping concentration exemplarily between $n=1 \cdot 10^{18}$ cm$^{-3}$ and $n=1 \cdot 10^{21}$ cm$^{-3}$. Exemplarily the second cathode layers 514 all have the same doping concentration. Likewise all second anode layers 513 may have the same doping concentration.

The base layer 55 of each GCT cell 52 is separated from neighbouring second anode layers 513 by an n-doped separation region 515 formed by the drift layer 56, respectively. The separation regions 515 between a diode cell 512 and a neighbouring GCT cell 52 have a lateral width (which is the minimum distance between the second anode layer 513 and the base layer 55 of a neighbouring GCT cell 52) adjacent to the first main side 530 of the wafer 51 between 20 μm and 150 μm, exemplarily between 50 μm and 100 μm. The width of the separation regions 515 must be large enough to avoid a punch-through effect to block the gate voltage required for turn-off or during blocking. On the other side the lateral width should be small enough to allow the electron hole plasma of each GCT cell 52, which forms in the drift layer 56 during on-state of the GCT cell 52, to spread into the neighbouring second diode cells 512.

In the present comparative example each gate electrode 510 is formed as part of a gate metallization layer on the base layers 55, wherein the surface of the first gate metallization layer opposite to the base layers 55 defines a first plane. The surfaces of the first cathode electrodes 53 opposite to the cathode regions 54a, 54b, 54c and the surfaces of the second anode electrodes 517 opposite to the second anode layers 513 define a second plane. In other words, all first cathode electrodes 53 and all second anode electrodes 517 are arranged coplanar. Therein, the first plane is parallel to the second plane and is shifted from the second plane in a direction from the first main side 530 towards the second main side 531. This height difference facilitates contacting the first cathode electrodes 53 and the second anode electrodes 517 on the first main side 530 with a metal plate, such as a molybdenum (Mo) disc in a standard press pack.

Exemplarily, the cathode electrode 53 has a thickness of at least 10 μm, exemplarily a thickness of at least 15 μm in a direction vertical to the first main side 530 of the wafer 51.

In the present comparative example, in an orthogonal projection onto a plane parallel to the first main side 530, the first anode layer 58 of each GCT cell 52 is aligned with the base layer 55 of the same GCT cell 52 to have a maximum overlap between these two layers in each GTC cell 52, and the second anode layer 513 of each diode cell 512 is aligned with the second cathode layer 514 of the same diode cell 512 to have a maximum overlap between these two layers in each diode cell 512.

In FIG. 5 which shows a top view onto the first main side 530 of the wafer 51 there can be seen the pattern of first cathode electrodes 53 formed on the top surface of the cathode regions 54a, 54b, 54c of the GCT cells 52 and of the second anode electrodes 517 which are formed on the top surface of the second anode layers 513, respectively. Each first cathode electrode 53 comprises three strip-shaped electrode portions 53a, 53b, 53c, which correspond to the three strip-shaped cathode regions 54a, 54b, 54c of the respective GCT cell 52. The second anode electrode 517 is strip-shaped corresponding to the strip-shape of the second anode layer 513 of the respective diode cell 512.

The longitudinal directions of the strip-shaped cathode electrode portions 53a, 53b, 53c of each first cathode electrode 53 and the strip-shaped second anode electrodes 517 have its longitudinal direction aligned in radial direction which is a direction extending from the centre of the device and being parallel to the first main side 530 of the wafer 51. Therein, the centre of the device is the centre of the first main side 530 of the circular wafer 51.

In the comparative example shown in FIG. 5, the plurality of GCT cells 52 and the plurality of diode cells 512 are arranged in two concentric rings around the centre of the device. In each ring the GCT cells 52 alternate with the diode cells 512. The second anode layers 513 of the diode cells 512 alternate with the first cathode layers 54 of the GCT cells 52 in a lateral direction along the concentric rings, so that, in an orthogonal projection onto a plane parallel to the first main side 530, the cathode regions 54a, 54b, 54c of each GCT cell 52 are arranged between a pair of second anode layers 513 of two diode cells 512 neighbouring to the GCT cell 52 on opposite sides of the GCT cell 52 in the lateral direction. Therefore, in FIG. 5 the second anode electrodes 517 alternate with the first cathode electrodes 53, which comprise three strip-shaped cathode electrode portions 53a, 53b, 53c, respectively, as described above. In each ring the length of each strip-shaped cathode region 54a, 54b, 54c in this ring is identical to the length of any other strip-shaped cathode region 54a, 54b, 54c in this ring.

Due to the GCT cells 52 alternating with the diode cells 512, in an orthogonal projection onto the plane parallel to the first main side 530, each diode cell 512 is arranged such that one second anode layer 513 is arranged between the first cathode layers 54 of two neighbouring GCT cells 52 in a lateral direction parallel to the first main side 530.

In the centre region on the first main side 530 of the circular wafer 51 there is arranged a common gate contact 511 to which all gate electrodes 510 of the plurality of GCT cells 52 are electrically connected. The gate electrodes 510 of the GCT cells 52 and the connections there between are implemented as the gate metallization layer described above.

Due to the interdigitated arrangement of diode cells 512 and the GCT cells 52 the full silicon area of the wafer 51 is utilized both electrically and thermally.

As can be seen in FIG. 6, all interfaces between the cathode regions 54a, 54b, 54c of the cathode layers 54 and the cathode electrode portions 53a, 53b, 53c of the cathode electrodes 53 and all interfaces between the base layers 55 and the gate electrodes 510 of the plurality of thyristor cells 52 are flat and coplanar.

FIG. 7 shows an enlarged portion of the cross-section of the turn-off power semiconductor device in FIG. 6 with further details of the turn-off power semiconductor device, which are not shown in FIG. 6. The enlarged portion shown in FIG. 7 includes two strip-shaped cathode regions 54a and 54b and a portion of the gate electrode 510 between these two cathode regions 54a and 54b. The base layer 55 includes a gate well region 522 extending from the gate electrode to a depth $d_W$ which is at least half of a depth $d_C$ of the cathode regions 54a and 54b. Exemplarily, the depth $d_W$ of the gate well region 522 is at least the same as the depth $d_C$ of the cathode regions 54a and 54b, exemplarily it is greater than the depth $d_C$ of the cathode regions 54a and 54b. The depth $d_W$ of the gate well region 522 may be at least 5 μm, exemplarily it may be at least 10 μm. The depth $d_C$ of the cathode regions 54a, 54b may be at least 10 μm, exemplarily it may be at least 15 μm. For any depth (distance from the first main side 530), the minimum doping concentration of the gate well region 522 at this depth is 50% above a doping concentration of the base layer 55 between the cathode region 54a, 54b and the gate well region 522 at this depth and at a lateral position, which has in an orthogonal projection onto a plane parallel to the first main side 530 a distance of 2 μm from the cathode region 54a, 54b. Exemplarily, for any depth, the local doping concentrations of the base layer 55 at all points at this depth and at lateral positions, which have in an orthogonal projection onto a plane parallel to the first main side 530 a distance of 2 μm from the cathode region 54a, 54b are the same. Exemplarily, the doping concentration of the gate well region 522 is in a range between $p=3 \cdot 10^{17}$ cm$^{-3}$ and $p=5 \cdot 10^{18}$ cm$^{-3}$ adjacent to the first main side 530, while the doping concentration of the base layer 55 in a region beneath the cathode regions is exemplarily in a range between $p=1 \cdot 10^{17}$ cm$^{-3}$ and $p=8 \cdot 10^{17}$ cm$^{-3}$. The lateral distance d between the gate well region 522 and the neighbouring cathode region 54a is more than 2 μm. Likewise, a distance between the gate well region 522 and the cathode region 54b is more than 2 μm.

On the first main side of the wafer 51 there is disposed an oxide passivation layer 519. The cathode electrode portion 53a is in contact with the cathode region 54a through a first opening 520a in the oxide passivation layer 519, the cathode portion 53b is in contact with the cathode region 54b through another first opening 520b in the oxide passivation layer 519, and the gate electrode 510 is in contact with a gate well region 522 through a second opening 521 in the oxide passivation layer 519. A lateral width $w_O$ of the first opening 520a is smaller than the lateral width $w_C$ of the cathode region 54a, and the oxide passivation layer 519 covers edge portions of the cathode regions 54a. In this manner it is ensured that the cathode electrode portion 53a is only in contact with the cathode region 54a and does not make contact with the base layer 55. Likewise a lateral width of the second opening 521 is smaller than a width of the gate well region 522, and a lateral width of the first opening 520b is smaller than a lateral width of the cathode region 54b. In an orthogonal projection onto a plane parallel to the first main side 530, the outer edges of the cathode electrode portions 53a and 53b as well as the outer edges of the gate electrode overlap with the oxide passivation layer 519. The difference between the lateral width $w_O$ of the first openings 520a, 520b and the lateral width $w_C$ of the cathode regions 54a, 54b, respectively, may be less than 30 μm. exemplarily the difference $w_O$-$w_C$ may be more than 10 μm but less than 30 μm. Due to the flat design of the cathode regions it is possible to use wider openings relative to the width of the cathode regions 54a, 54b compared to the device of the prior art having a cathode mesa structure (i.e. steps in the wafer surface). Moreover, the flat design allows to make the cathode electrode portions 53a and 53b wider than the width $w_C$ of the cathode regions 54a and 54b, respectively. The wider electrode portions 54a and 54b result in an improved thermal and electrical contact.

As described already with reference to FIG. 6, it can be seen also from FIG. 7 that the interface between the cathode electrode portion 53a and the cathode region 54a, the interface between the gate electrode 510 and the base layer 55, and the interface between the cathode electrode portion 53b and the cathode region 54b are all flat and coplanar. As can be seen from FIG. 7 the interface between the gate electrode 510 and the base layer 55 is a contact region between the gate electrode 510 and the gate well region 522.

A polyimide passivation layer 518 (corresponding to the insulating layer in the claims) is formed on the first main side 530 to cover parts of the oxide passivation layer 519 which are not covered by the cathode electrode portions 53a and 53b or by the gate electrode 510. Further the polyimide passivation layer 518 covers the gate electrode 510.

Figure 8:
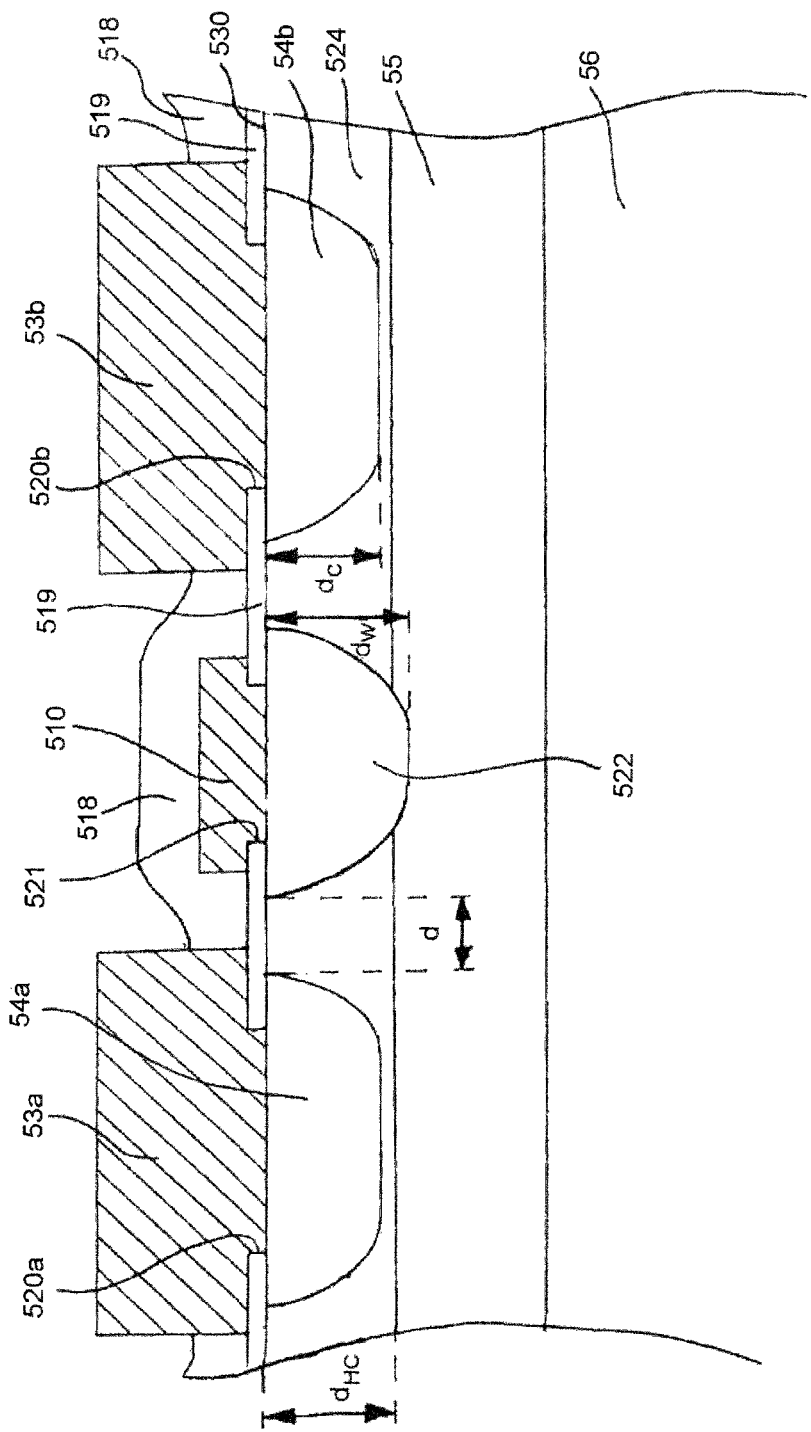
FIG. 8 shows a partial cross-section of a turn-off power semiconductor device according to an embodiment of the invention.

In FIG. 8 there is shown an embodiment of the turn-off power semiconductor device of the invention. The embodiment is similar to the above described comparative example. Therefore, only differences to the above described comparative example are described. With regard to all remaining features it is referred to the above description of the comparative example shown in FIGS. 5 to 7. The embodiment shown in FIG. 8 differs from the comparative example shown in FIGS. 5 to 7 only in that the base layer 55 comprises a compensated region 524, which is formed directly adjacent to the first main side 530 of the wafer 51, so that it is formed in a region between the cathode region 54a and the gate well region 522 and in a region between the cathode region 54b and the gate well region 522 in FIG. 8. The density of first conductivity type impurities relative to the doping concentration in the compensated region 524 is at least 0.4. In FIG. 8 the compensated region 524 extends from the first main side to a depth due, which is greater than the depth $d_C$ of the cathode regions 54a, 54b and less than the depth $d_W$ of the gate well region 522. The depth $d_{HC}$ may have any value which is at least half of the depth de of the cathode region. Exemplarily, the compensated region 524 extends from the first main side 530 to a depth due of at least 10 μm, exemplarily to a depth $d_{HC}$ of at least 15 μm.

With the compensated region 524 the gate-cathode blocking voltage (VGR) can be increased compared to a device without such compensated region 524 due to the lower doping concentration of the base layer 55 in this compensated region 524 at the pn-junction with the cathode regions 54a and 54b.

Figure 9:
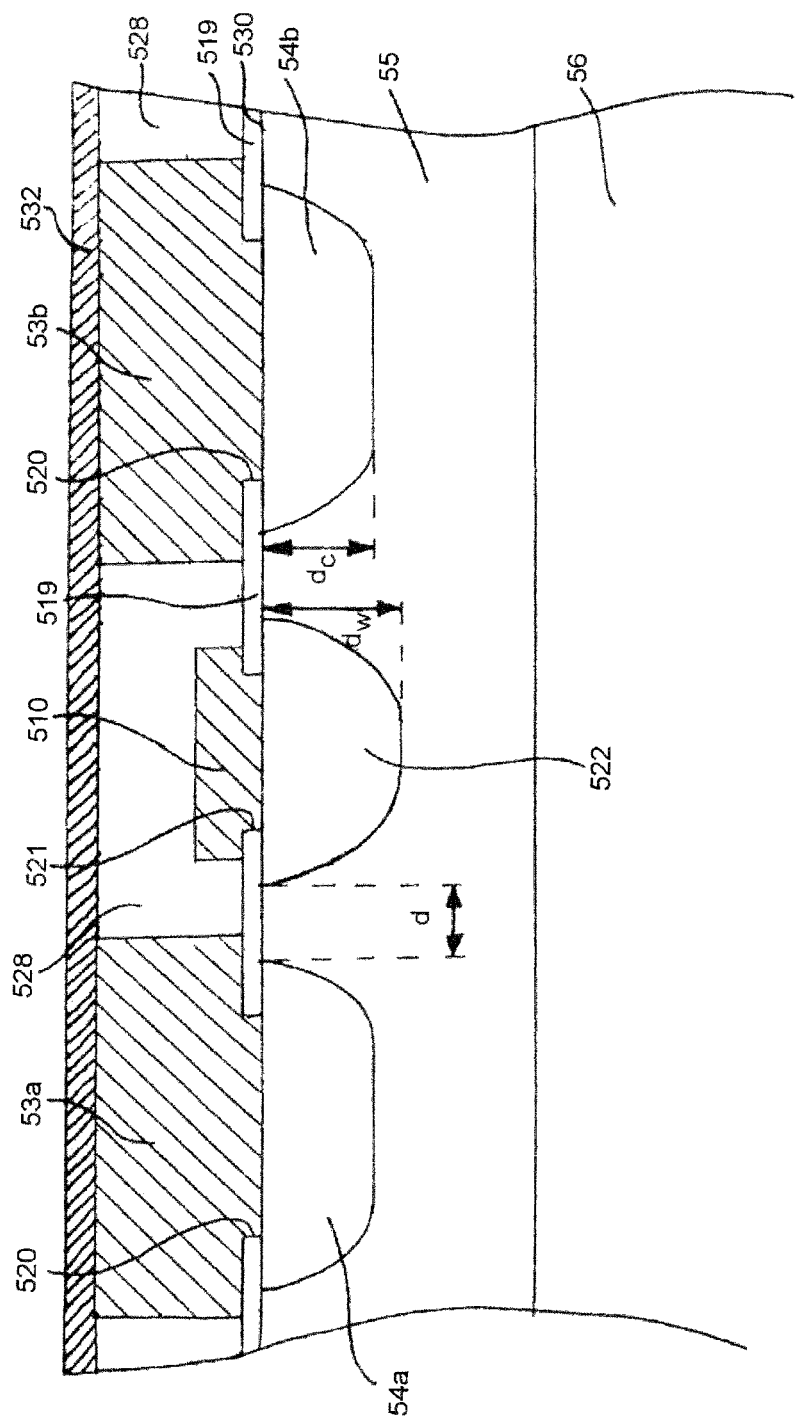
FIG. 9 partial cross-section of a turn-off power semiconductor device according to a modified comparative example.

In FIG. 9 there is shown another modified comparative example of the turn-off power semiconductor device. The modified comparative example shown in FIG. 9 is similar to the comparative example described above with reference to FIGS. 5 to 7. Therefore, only differences will be described. With regard to all remaining features it is referred to the above description of the comparative example shown in FIGS. 5 to 7. The modified comparative example shown in FIG. 9 differs from the comparative example shown in FIG. 7 in that the polyimide passivation layer 528 fills up the whole space between two neighbouring cathode electrode portions 53a and 53b. The upper surface of the polyimide passivation layer 528 is flat and coplanar with the upper surfaces of all cathode electrode portions 53a and 53b. In addition, a continuous cathode contact layer 532 implemented as a metallization layer is arranged on top of the cathode electrode portions 53a and 53b and on top of the polyimide passivation layer 528, so that the cathode contact layer 532 is in direct contact with the upper surfaces of cathode electrode portions 53a and 53b and the polyimide passivation layer 528. Although only two cathode electrode portions 53a and 53b are shown in FIG. 9, the cathode contact layer 532 is formed on the top surfaces of all cathode electrode portions 53a, 53b and on the top surfaces of the polyimide passivation layer 528 filling up the spaces between these cathode electrode portions 53a, 53b of the turn-off power semiconductor device. The polyimide passivation layer 528 can conduct heat generated in the turn-off power semiconductor device more efficiently away from device than air which fills up the space between neighbouring cathode electrode portions 53a and 53b in the comparative example shown in FIG. 7. In a standard press pack the continuous cathode contact layer 532 can provide an improved thermal and electrical contact from the turn-off power semiconductor device to the molybdenum disc (not shown in the Figures) pressed onto the cathode side (first main side 530) of the turn-off power semiconductor device. Furthermore, in this modified comparative example a short circuit, which might occur between the gate electrode 510 and the cathode electrode 53 due to small particles when a molybdenum disc is used in a standard press pack, can be efficiently avoided.

In the following an embodiment of a method for manufacturing a turn-off power semiconductor device according to the invention will be described. The method comprises a step of providing a semiconductor wafer 51' having a third main side 530' (corresponding to the first main side 530 of the semiconductor wafer 51 in the final turn-off power semiconductor device) and a fourth main side (corresponding to the second main side 531 of the semiconductor wafer 51 in the final turn-off power semiconductor device; not shown in the Figures) opposite to the third main side, the semiconductor wafer 51' comprising in the order from the third main side 530' to the fourth main side a p-doped first semiconductor layer 55', which forms the base layer 55 in the final turn-off power semiconductor device, a n⁻-doped second semiconductor layer 56', which forms the drift layer 56 in the final turn-off power semiconductor device, and a p⁺-doped third semiconductor layer (not shown in the Figure), which forms the anode layer 58 in the final turn-off power semiconductor device.

A first mask layer 540 is formed on the semiconductor wafer 51' and a plurality of n⁺-doped semiconductor regions 54a' and 54b' is formed within the first semiconductor layer 55' by selectively applying an n-type first dopant 542 into the first semiconductor layer 55' from the third main side 530' of the semiconductor wafer 51' through third openings 544a and 544b in the first mask layer 540. Therein, the plurality of n⁺-doped semiconductor regions 54a' and 54b' form the cathode regions 54a and 54b of the plurality of thyristor cells 52 in the final turn-off power semiconductor device. Throughout the specification applying a dopant can be performed by ion implantation or diffusion, for example.

Thereafter, a second mask layer 546 is formed on the first main side surface of the wafer 51'. Then the p-type doping concentration in a plurality of well regions 522' within the p-doped first semiconductor layer 55' is increased by selectively applying a p-type second dopant 549 into the first semiconductor layer 55' from the third main side 530' of the semiconductor wafer 51' through fourth openings 550 in the second mask layer 546. The well regions 522' are separated from the plurality of n⁺-doped semiconductor regions 54a' and 54b' and form the gate well regions 522 in the final turn-off power semiconductor device.

In a next step a n-type third dopant 551 is applied to the wafer from the third main side 530' to form a compensation layer 524' having a high concentration of the n-type third dopant 551 in a region adjacent to the third main side 530'. The n-type third dopant 551 is applied to the whole wafer 51 without using a mask layer so that the n-type third dopant 551 is also applied into the n⁺-doped semiconductor regions 54a' and 54b' and into the well regions 522'.

Figure 10A:
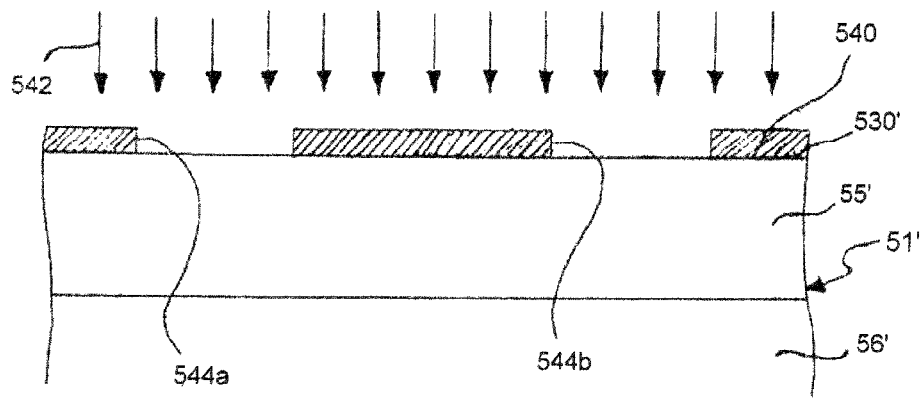
FIGS. 10A to 10E illustrate a method for manufacturing a turn-off power semiconductor device according to an embodiment of the invention.
Figure 10B:
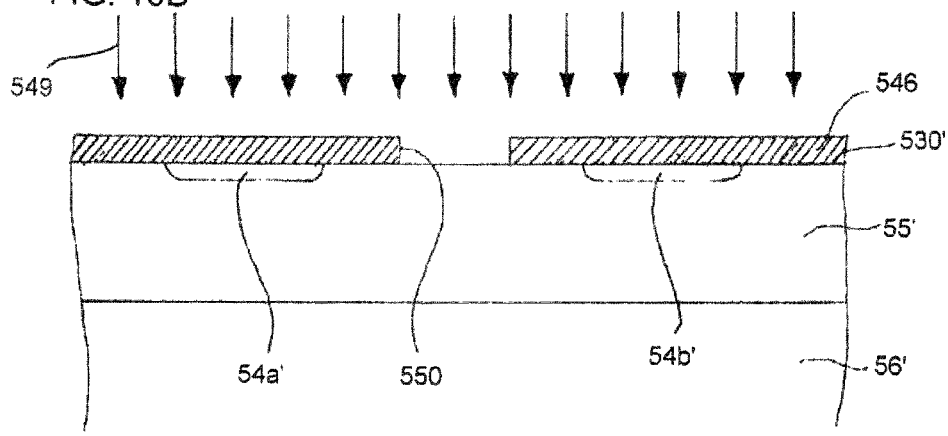
Figure 10C:
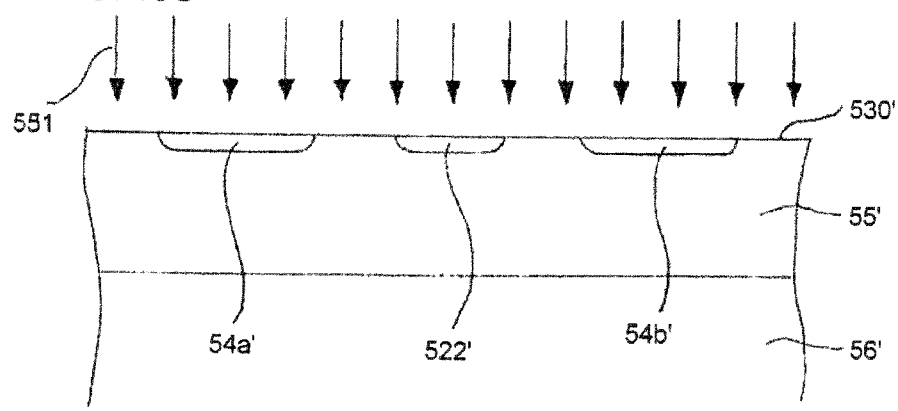
Figure 10D:
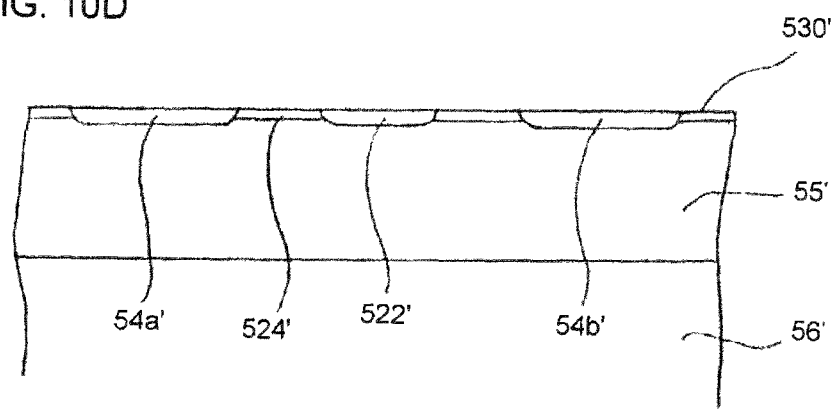
Figure 10E:
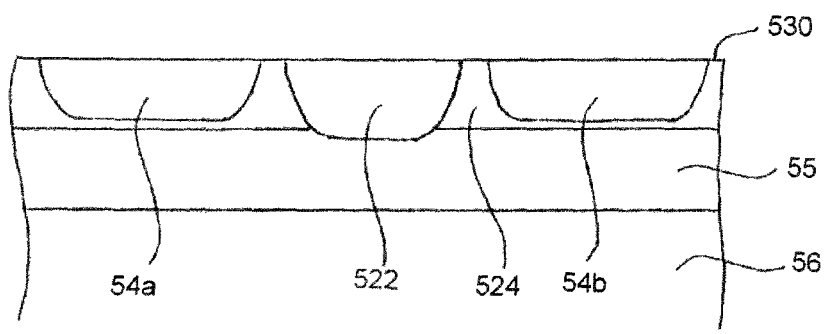

In a subsequent drive-in step the first dopant of the n⁺-doped semiconductor regions 54a' and 54b', the second dopant of the well regions 522' and the third dopant of the compensation layer 524' are driven into the wafer 51' to obtain the cathode regions 54a and 54b, the gate well regions 522 and the compensated region 524 as described above with FIG. 8. The semiconductor wafer 51 after the drive-in step is shown in FIG. 10E.

The final turn-off power semiconductor device as shown in FIG. 8 is obtained by forming the oxide passivation layer 519, selectively forming a first metallization layer to form the cathode electrodes 53 of the plurality of thyristor cells, selectively forming a second metallization layer to form the gate electrodes of the plurality of thyristor cells; and forming the polyimide passivation layer 518. The method for manufacturing a power semiconductor device may further comprise a step of increasing the thickness of the cathode electrodes in a direction vertical to the first main side 530 by selective plating.

It will be apparent for persons skilled in the art that modifications of the above described embodiment are possible without departing from the idea of the invention as defined by the appended claims.

In the above described embodiments the turn-off power semiconductor device was described with first cathode layers 54 which comprise three strip-shaped cathode regions 54a, 54b, 54c, respectively. However, it is also possible to use any other number of cathode regions, exemplarily one to six strip-shaped cathode regions could be included in each GCT cell 52. Exemplarily, in the turn-off power semiconductor device of the invention, the ratio of the number of diode cells 512 relative to the number of cathode regions 54a, 54b, 54c may be in a range from 1:1 to 1:5, exemplarily 1:2 or 1:4.

In the above described embodiments the GCT cells 52 alternate with the diode cells 512 in each concentric ring along the whole ring, i.e. the GCT cells 52 alternate with the diode cells 512 on the whole wafer area, in a lateral direction. However, it is also possible that the GCT cells 52 alternate with the diode cells 512 not on the whole wafer area but only in a mixed part, whereas the remaining part of the wafer includes GCT cells 52 which do not alternate with diode cells 512. Such part may be referred to as a pilot part. Likewise the wafer may comprise an area in which diode cells are formed which do not alternate with the GCT cells 52 in this part.

Also, the turn-off power semiconductor device of the invention may not be a reverse conducting power semiconductor device and may not include any diode cell 412. For example, the turn-off power semiconductor device may be any other type of integrated gate commutated thyristor (IGCT), such as an asymmetric IGCf, a bi-mode GCT, a bi-directional turn-off thyristor, or a reverse blocking IGCT, or it may be any type of gate turn-off thyristor (GTO, such as an asymmetric GTO, a reverse blocking GTO or a reverse conducting GTO.

The base layers 55 of neighbouring thyristor cells 52 in the turn-off power semiconductor device of the invention may be in direct contact with each other, i.e. neighbouring thyristor cells 52 may share a common base layer 55, or they may be separated from each other as in the above described embodiments. Likewise the drift layers 56 of neighbouring thyristor cells 55 may be in direct contact with each other, i.e. the neighbouring thyristor cells 55 may share a common drift layer 56 as in the above described embodiments, or they may be separated from each other. The anode layers 58 of neighbouring thyristor cells 52 may be in direct contact with each other, i.e. the neighbouring thyristor cells 52 may share a common anode layer 58, or they may be separated from each other. Likewise each cathode region 54a, 54b, 54c may be in direct contact with a neighbouring cathode region 54a, 54b, 54c or may be separated from a neighbouring cathode region 54a, 54b, 54c at least by the base layer 55 of the same thyristor cell 52 to which the cathode region 54a, 54b, 54c belongs as in the above embodiment.

In the above described embodiments the turn-off power semiconductor device was described with a circular silicon wafer 51. However, the wafer 51 may have any other shape, such as a rectangular shape, or may be made of a different semiconductor material, such as silicon carbide or a group-III-nitride such as (AlGaIn)N.

The embodiments of the invention were described with a very specific alternating arrangement of the GCT cells 52 and diode cells 512 in two concentric rings. However other arrangements may be employed. The number of concentric rings in which the GCT cells 52 and the diode cells 512 are arranged may be any other number of rings. Also the arrangement of the GCT cells 52 and the diode cells 512 on a rectangular wafer may be an arrangement, in which the strip-shaped second anode layers 513 and the strip-shaped cathode regions 54a, 54b, 54c are arranged parallel to each other. Such arrangement would be preferable for a rectangular wafer shape, for example.

In the above embodiments, the turn-off power semiconductor device was described with the buffer layer 57. However, in a modified embodiment, the turn-off power semiconductor device may not comprise the buffer layer 57. In this modified embodiment the thickness of the drift layer 56 in a direction perpendicular to the first main side 530 of the wafer 31 would have to be larger by a factor of about two compared to the above described embodiment with the buffer layer 57 in order to avoid punch-through under reverse bias conditions during blocking and turn-off conditions.

The above embodiments were explained with specific conductivity types. The conductivity types of the semiconductor layers in the above described embodiments might be switched, so that all layers which were described as p-type layers would be n-type layers and all layers which were described as n-type layers would be p-type layers. For example, in a modified embodiment, the GCT cells 52 could include a p-doped first cathode layer 54, a n-doped base layer 55, a p-doped drift layer 56, and a n-doped first anode layer 58.

The above embodiments were described with a central common gate contact 511. The invention is not limited to such central common gate contact 511. It would also be possible to have a ring-shaped common gate contact at the perimeter of the wafer 51 or between two rings somewhere between the perimeter and the centre of the wafer 51, which can be advantageous to homogenize the current distribution of a gate current pulse.

In the method according to the embodiment described above with FIGS. 10A to 10E the n-type third dopant 551 for forming the compensated region 524 was applied uniformly to the whole first main side 530 of the wafer 51'. However, it is also possible to apply the n-type third dopant 551 selectively to form the compensated region 524 at least in a region located between the cathode regions 54a, 54b and the gate well regions 522 of the plurality of thyristor cells 52 in the final turn-off power semiconductor device.

In the method according to the embodiment described above with FIGS. 10A to 10E, the different method steps were described in a certain order. However the method steps may be performed in a different order. For example the well regions 522' could be formed before the n+-doped semiconductor regions 54a' and 54b'. Also, the wafer 51' may not comprise the p+-doped third semiconductor layer, but the doping for the anode layer 58 may be applied only at a later stage.

Moreover the method for manufacturing a turn-off power semiconductor device of the invention the step of forming the polyimide passivation layer 528 may be adapted to obtain a polyimide passivation layer 528 as described in the embodiment shown in FIG. 9. In addition the method may include a step of forming the continuous cathode contact layer 532 to obtain the turn-off power semiconductor device as shown in FIG. 9.

In the above embodiments the passivation layers 518 and 528 (corresponding to the insulating layer in the claims) were described to be polyimide passivation layers 518 and 528. However, it is also possible to use other polymers and oxides deposited by sol-gel processes, spin-on processes, printing, lamination or similar processes for the insulating layer in the claims.

It should be noted that the term "comprising" does not exclude other elements or steps and that the indefinite article "a" or "an" does not exclude the plural. Also elements described in association with different embodiments may be combined.

| List of reference signs | |
| --- | --- |
| 1 | wafer |
| 2 | gate commutated thyristor (GCT) cell |
| 3 | cathode electrode |
| 4 | cathode segment |
| 5 | (p-doped) base layer |
| 6 | (n--doped) drift layer |
| 7 | (n-doped) buffer layer |
| 8 | (p+-doped) anode layer |
| 9 | anode electrode |
| 10 | gate electrode |
| 11 | gate contact |
| 12 | diode cell |
| 13 | (p-doped) anode layer |
| 14 | (n+-doped) cathode layer |
| 15 | separation region |
| 16 | cathode electrode |
| 17 | anode electrode |
| 18 | polyimide passivation layer |
| 19 | oxide passivation layer |
| 20 | first opening |
| 21 | second opening |
| 25 | patterned protection oxide layer |
| 26 | highly n+-doped layer |
| 26' | structured highly n+-doped layer |
| 51 | semiconductor wafer |

-continued

| List of reference signs | |
|---|---|
| 51' | semiconductor wafer |
| 52 | gate commutated thyristor (GCT) cell |
| 53 | first cathode electrode |
| 53a, b | cathode electrode portion |
| 54 | (n+-doped) first cathode layer |
| 54a, b, c | cathode region |
| 54a', b' | n+-doped semiconductor region |
| 55 | (p-doped) base layer |
| 55' | p-doped first semiconductor layer |
| 56 | (n--doped) drift layer |
| 56' | n--doped second semiconductor layer |
| 57 | (n-doped) buffer layer |
| 58 | (p+-doped) first anode layer |
| 59 | first anode electrode |
| 510 | gate electrode |
| 511 | common gate contact |
| 512 | diode cell |
| 513 | (p-doped) second anode layer |
| 514 | (n+-doped) second cathode layer |
| 515 | (n-doped) separation region |
| 516 | second cathode electrode |
| 517 | second anode electrode |
| 518 | polyimide passivation layer |
| 519 | oxide passivation layer |
| 520a, b | first opening |
| 521 | second opening |
| 522 | gate well region |
| 522' | well region |
| 524' | compensation layer |
| 524 | compensated region |
| 528 | polyimide passivation layer |
| 530 | first main side |
| 530' | third main side |
| 531 | second main side |
| 532 | cathode contact layer |
| 540 | first mask layer |
| 542 | n-type first dopant |
| 544a, b | third opening |
| 546 | second mask layer |
| 549 | p-type second dopant |
| 550 | fourth opening |
| 551 | n-type third dopant |
| dC | depth of the cathode region |
| dW | depth of the gate well region |
| d | distance between gate well region and cathode region |
| dHC | depth of compensated region |
| wO | width of the first opening |
| wC | width of the cathode region |

The invention claimed is:

1. A turn-off power semiconductor device comprising:
a semiconductor wafer having a first main side and a second main side opposite to the first main side;
a plurality of thyristor cells, each of the plurality of thyristor cells comprising in the order from the first main side to the second main side:
(a) a cathode region of a first conductivity type;
(b) a base layer of a second conductivity type different from the first conductivity type, wherein the cathode region is formed as a well in the base layer to form a first p-n junction between the base layer and the cathode region;
(c) a drift layer of the first conductivity type forming a second p-n junction with the base layer; and
(d) an anode layer of the second conductivity type separated from the base layer by the drift layer,
wherein each thyristor cell comprises: a gate electrode which is arranged lateral to the cathode region and forms an ohmic contact with the base layer; a cathode electrode arranged on the first main side and forming an ohmic contact with the cathode region; and an anode electrode arranged on the second main side and forming an ohmic contact with the anode layer,
wherein interfaces between the cathode regions and the cathode electrodes and interfaces between the base layers and the gate electrodes of the plurality of thyristor cells are flat and coplanar, and
wherein the base layer includes a gate well region extending from its contact with the gate electrode to a depth ($d_W$) which is at least half of a depth ($d_C$) of the cathode region,
wherein, for any depth, the minimum doping concentration of the gate well region at this depth is 50% above a doping concentration of the base layer between the cathode region and the gate well region at this depth and at a lateral position, which has in an orthogonal projection onto a plane parallel to the first main side a distance of 2 μm from the cathode region, and
the base layer includes a compensated region of the second conductivity type, the compensated region being arranged directly adjacent to the first main side and between the cathode region and the gate well region, wherein a ratio between the density of first conductivity type impurities and the net doping concentration in the compensated region is at least 0.4.

2. The turn-off power semiconductor device according to claim 1, wherein the depth ($d_W$) of the gate well region is at least the depth ($d_C$) of the cathode region.

3. The turn-off power semiconductor device according to claim 2, wherein the depth ($d_W$) of the gate well region is at least 5 μm.

4. The turn-off power semiconductor device according to claim 2, wherein the depth ($d_C$) of the cathode region is at least 10 μm.

5. The turn-off power semiconductor device according to claim 2, wherein the doping concentration of a portion of the base layer, which is arranged directly adjacent to the first main side and which is arranged between the cathode region and the gate well region, is increasing with increasing distance from the first main side.

6. The turn-off power semiconductor device according to claim 2, wherein the compensated region extends from the first main side to a depth ($d_{HC}$), which is at least the depth ($d_C$) of the cathode region.

7. The turn-off power semiconductor device according to claim 1, wherein the depth ($d_W$) of the gate well region is at least 5 μm.

8. The turn-off power semiconductor device according to claim 7, wherein the doping concentration of a portion of the base layer, which is arranged directly adjacent to the first main side and which is arranged between the cathode region and the gate well region, is increasing with increasing distance from the first main side.

9. The turn-off power semiconductor device according to claim 7, wherein the compensated region extends from the first main side to a depth ($d_{HC}$), which is at least the depth ($d_C$) of the cathode region.

10. The turn-off power semiconductor device according to claim 1, wherein the depth ($d_C$) of the cathode region is at least 10 μm.

11. The turn-off power semiconductor device according to claim 1, wherein the doping concentration of a portion of the base layer, which is arranged directly adjacent to the first main side and which is arranged between the cathode region and the gate well region, is increasing with increasing distance from the first main side.

12. The turn-off power semiconductor device according to claim 1, wherein the compensated region extends from the first main side to a depth ($d_{HC}$), which is at least the depth ($d_C$) of the cathode region.

13. The turn-off power semiconductor device according to claim 1, wherein the compensated region extends from the first main side to a depth ($d_{HC}$) of at least 10 µm.

14. The turn-off power semiconductor device according to claim 1, wherein the cathode electrode has a thickness of at least 10 µm.

15. The turn-off power semiconductor device according to claim 1, wherein a space between neighbouring cathode electrodes is filled up with an insulating layer, and wherein a continuous cathode contact layer is arranged on top of the cathode electrodes and the insulating layer to be in direct contact with the cathode electrodes and the insulating layer.

16. The turn-off power semiconductor device according to claim 1, wherein the depth ($d_W$) of the gate well region is at least 10 µm.

17. The turn-off power semiconductor device according to claim 1, wherein the depth ($d_C$) of the cathode region is at least 15 µm.

* * * * *